US012674346B2

(12) United States Patent
Siems

(10) Patent No.: US 12,674,346 B2
(45) Date of Patent: Jul. 7, 2026

(54) SYSTEMS AND METHODS FOR SERVICING OF HEAT CAPTURE CABINET

(71) Applicant: Dell Products L.P., Round Rock, TX (US)

(72) Inventor: Derek Siems, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 96 days.

(21) Appl. No.: 18/807,676

(22) Filed: Aug. 16, 2024

(65) Prior Publication Data

US 2026/0049512 A1 Feb. 19, 2026

(51) Int. Cl.
*E05D 15/26* (2006.01)
*H05K 7/20* (2006.01)

(52) U.S. Cl.
CPC .......... *E05D 15/266* (2013.01); *H05K 7/206* (2013.01); *H05K 7/20781* (2013.01); *E05Y 2900/20* (2013.01)

(58) Field of Classification Search
CPC ...... H05K 7/1488; H05K 7/1489; H05K 7/20; H05K 7/20736; H05K 7/20781; H05K 7/206; H05K 7/2019; H05K 7/20818; E05D 15/226; E05Y 2900/20; E06B 3/48; E06B 3/481; E06B 3/482; E06B 3/483; E06B 3/485; E06B 3/486; A47B 96/16; A47B 53/00; A47B 61/00; A47B 67/005; A47B 67/02; A47B 17/04
USPC ......... 312/236, 249.7, 297, 298, 300, 321.5, 312/324
See application file for complete search history.

(56) References Cited

U.S. PATENT DOCUMENTS

| 184,375 | A | * | 11/1876 | Hansen | A47B 53/00 |
| | | | | | 312/316 |
| 1,408,731 | A | * | 3/1922 | Harris | A47B 61/00 |
| | | | | | 211/180 |
| 3,140,134 | A | * | 7/1964 | Nairn | A47K 5/02 |
| | | | | | 312/227 |
| 4,502,742 | A | * | 3/1985 | Neff | A47B 53/00 |
| | | | | | 312/324 |
| 7,450,385 | B1 | * | 11/2008 | Campbell | H05K 7/20781 |
| | | | | | 361/689 |
| 7,619,887 | B2 | * | 11/2009 | Koch | H05K 7/20781 |
| | | | | | 361/689 |
| 9,297,571 | B1 | * | 3/2016 | Correa | F25D 19/00 |
| 2009/0223240 | A1 | * | 9/2009 | Bean, Jr. | H05K 7/20781 |
| | | | | | 165/228 |
| 2012/0138285 | A1 | * | 6/2012 | Tsubaki | H05K 7/20781 |
| | | | | | 165/104.14 |
| 2013/0306269 | A1 | * | 11/2013 | Helbig | H05K 7/20709 |
| | | | | | 29/890.03 |

* cited by examiner

Primary Examiner — Daniel J Troy
Assistant Examiner — Elizabeth Irene Artalejo
(74) Attorney, Agent, or Firm — Jackson Walker L.L.P.

(57) ABSTRACT

A cabinet may include a rack configured to house one or more information handling systems and a door comprising a first mechanical assembly configured to rotatably couple, via a first vertical edge of the first mechanical assembly, to the rack via a first hinge assembly, and a second mechanical assembly configured to rotatably couple, via a second vertical edge of the first mechanical assembly, to the first mechanical assembly via a second hinge assembly, such that an axis of rotation of the first hinge assembly is substantially parallel to an axis of rotation of the second hinge assembly.

6 Claims, 4 Drawing Sheets

SYSTEMS AND METHODS FOR SERVICING OF HEAT CAPTURE CABINET

TECHNICAL FIELD

The present disclosure relates in general to information handling systems, and more particularly to a door to enable servicing of a heat capture cabinet comprising one or more information handling systems.

BACKGROUND

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

As processors, graphics cards, random access memory (RAM) and other components in information handling systems have increased in clock speed and power consumption, the amount of heat produced by such components as a side-effect of normal operation has also increased. Often, the temperatures of these components need to be kept within a reasonable range to prevent overheating, instability, malfunction and damage leading to a shortened component lifespan. Accordingly, thermal management systems including air movers (e.g., cooling fans and blowers) and liquid cooling systems have often been used in information handling systems to cool information handling systems and their components. Some thermal management systems utilize air movers and liquid-cooled heat exchangers (e.g., a radiator with liquid-cooled cooling coils).

Further, information handling systems may be housed in a cabinet configured to hold a plurality of modular information handling systems and other components, such as air movers and liquid-cooled heat exchangers. One type of cabinet that may be used to house information handling systems is known as a heat capture cabinet. A heat capture cabinet may be a thermally self-contained cabinet in which the air inside the heat capture cabinet is predominantly isolated from the air outside the heat capture cabinet. Thus, as opposed to traditional approaches in which cooling air is drawn into a cabinet by air movers from space external to the cabinet and also expelled into the external space, airflow may be recirculated in a heat capture cabinet such that the cabinet captures as much waste heat energy as possible from the information handling systems therein. Accordingly, with heat contained within the enclosure of the heat capture cabinet, facility cooling costs of a building housing the heat capture cabinet may be minimized, or in some instances, heat capture cabinets may enable use of facilities without air conditioning, provided they have a sufficient supply of coolant (e.g., water) for cooling the heat capture cabinet.

In some heat capture cabinets, a cooling coil and air mover unit may be integrated within a service door at the rear of the server rack, wherein such door may be accessed for servicing components residing within the heat capture cabinet. While existing room-exit rear door heat exchangers are currently designed to clear one another when opened, when the necessary enclosure is added to an existing cabinet to enable air recirculation within the cabinet, the total rear door enclosure may get wider and/or deeper and may no longer be opened side-by-side with another heat capture cabinet using a conventional door hinge.

SUMMARY

In accordance with the teachings of the present disclosure, disadvantages and problems associated with servicing of a heat capture cabinet housing information handling systems may be reduced or eliminated.

In accordance with embodiments of the present disclosure, a cabinet may include a rack configured to house one or more information handling systems and a door comprising a first mechanical assembly configured to rotatably couple, via a first vertical edge of the first mechanical assembly, to the rack via a first hinge assembly, and a second mechanical assembly configured to rotatably couple, via a second vertical edge of the first mechanical assembly, to the first mechanical assembly via a second hinge assembly, such that an axis of rotation of the first hinge assembly is substantially parallel to an axis of rotation of the second hinge assembly.

In accordance with these and other embodiments of the present disclosure, a door configured to mechanically couple to a rack configured to house one or more information handling systems may include a first mechanical assembly configured to rotatably couple, via a first vertical edge of the first mechanical assembly, to the rack via a first hinge assembly and a second mechanical assembly configured to rotatably couple, via a second vertical edge of the first mechanical assembly, to the first mechanical assembly via a second hinge assembly, such that an axis of rotation of the first hinge assembly is substantially parallel to an axis of rotation of the second hinge assembly.

In accordance with these and other embodiments of the present disclosure, a method may include rotatably coupling a first mechanical assembly of a door, via a first vertical edge of the first mechanical assembly, to a rack configured to house one or more information handling systems via a first hinge assembly and rotatably coupling a second mechanical assembly, via a second vertical edge of the first mechanical assembly, to the first mechanical assembly via a second hinge assembly, such that an axis of rotation of the first hinge assembly is substantially parallel to an axis of rotation of the second hinge assembly.

Technical advantages of the present disclosure may be readily apparent to one skilled in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Preferred embodiments and their advantages are best understood by reference to FIGS. 1A through 2B, wherein like numbers are used to indicate like and corresponding parts.

For the purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system may be a personal computer, a PDA, a consumer electronic device, a network storage device, or any other suitable device and may vary in size, shape, performance, functionality, and price. The information handling system may include memory, one or more processing resources such as a central processing unit (CPU) or hardware or software control logic. Additional components of the information handling system may include one or more storage devices, one or more communications ports for communicating with external devices as well as various input and output (I/O) devices, such as a keyboard, a mouse, and a video display. The information handling system may also include one or more buses operable to transmit communication between the various hardware components.

For the purposes of this disclosure, computer-readable media may include any instrumentality or aggregation of instrumentalities that may retain data and/or instructions for a period of time. Computer-readable media may include, without limitation, storage media such as a direct access storage device (e.g., a hard disk drive or floppy disk), a sequential access storage device (e.g., a tape disk drive), compact disk, CD-ROM, DVD, random access memory (RAM), read-only memory (ROM), electrically erasable programmable read-only memory (EEPROM), and/or flash memory; as well as communications media such as wires, optical fibers, microwaves, radio waves, and other electromagnetic and/or optical carriers; and/or any combination of the foregoing.

For the purposes of this disclosure, information handling resources may broadly refer to any component system, device or apparatus of an information handling system, including without limitation processors, buses, memories, I/O devices and/or interfaces, storage resources, network interfaces, motherboards, integrated circuit packages; electro-mechanical devices (e.g., air movers), displays, and power supplies.

Figure 1A:
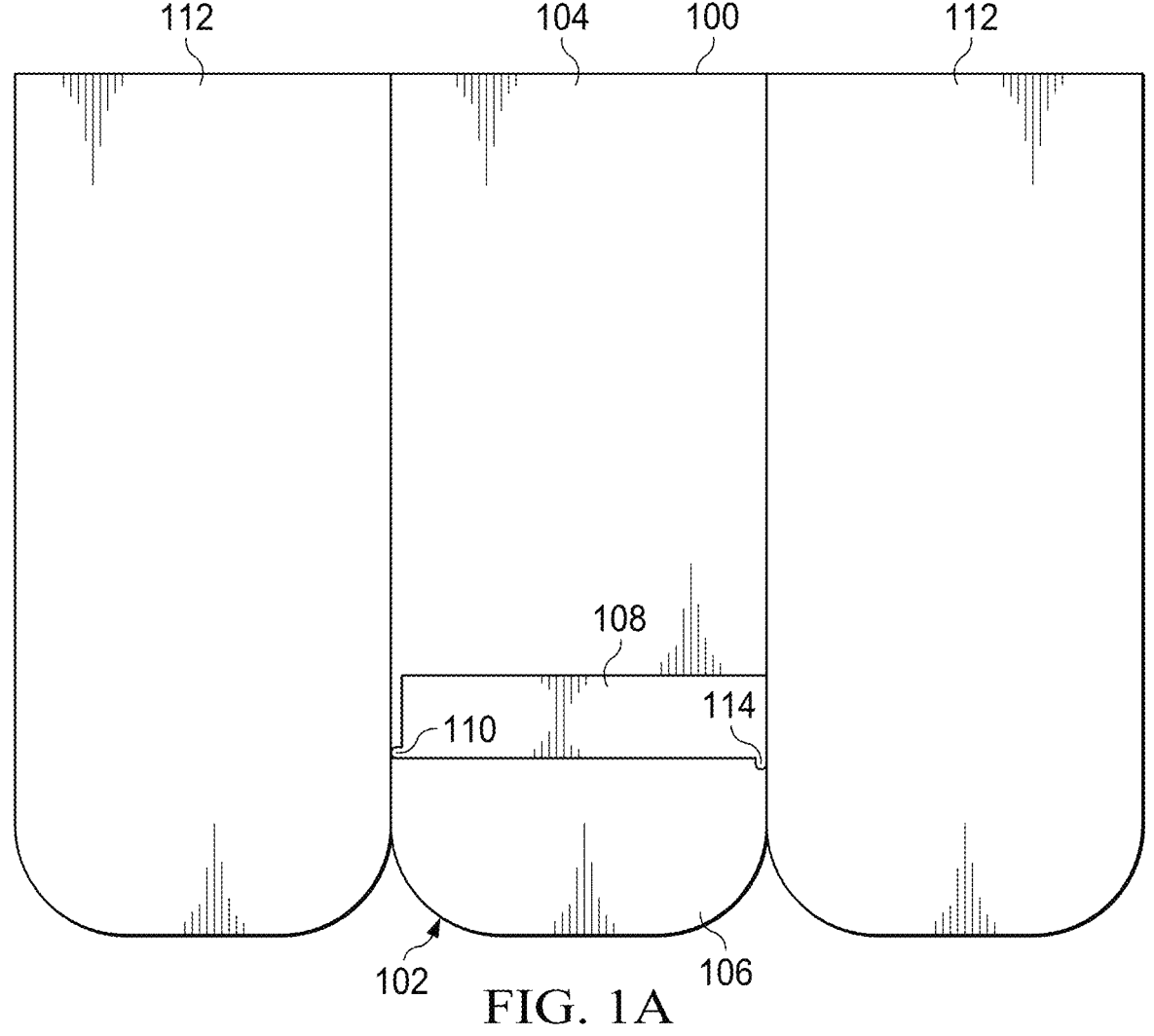
FIG. 1A illustrates a top-down plan view of a cabinet with its door in a closed position, in accordance with embodiments of the present disclosure.
Figure 1B:
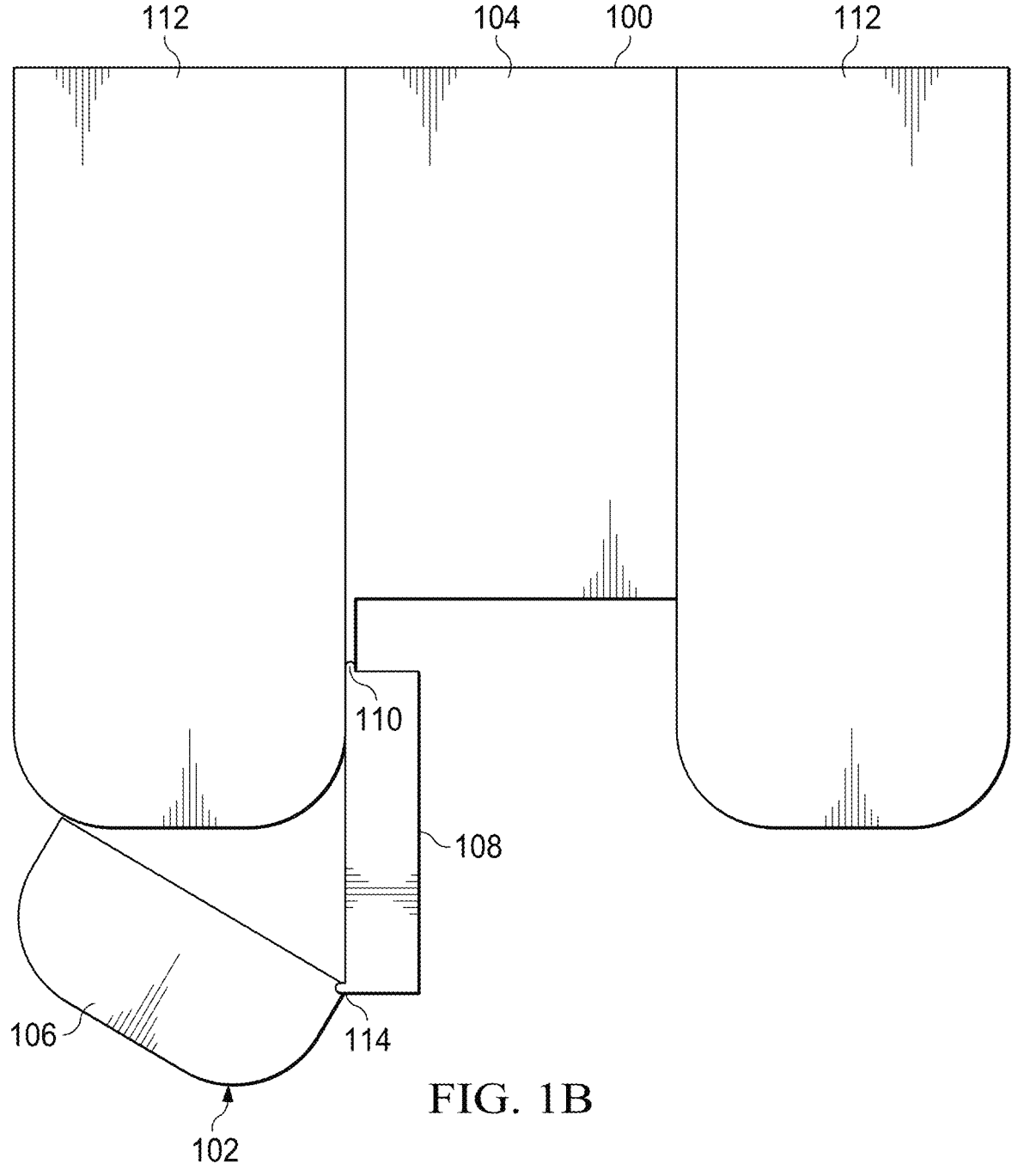
FIG. 1B illustrates a top-down plan view of a cabinet with its door in an open position, in accordance with embodiments of the present disclosure.
Figure 2A:
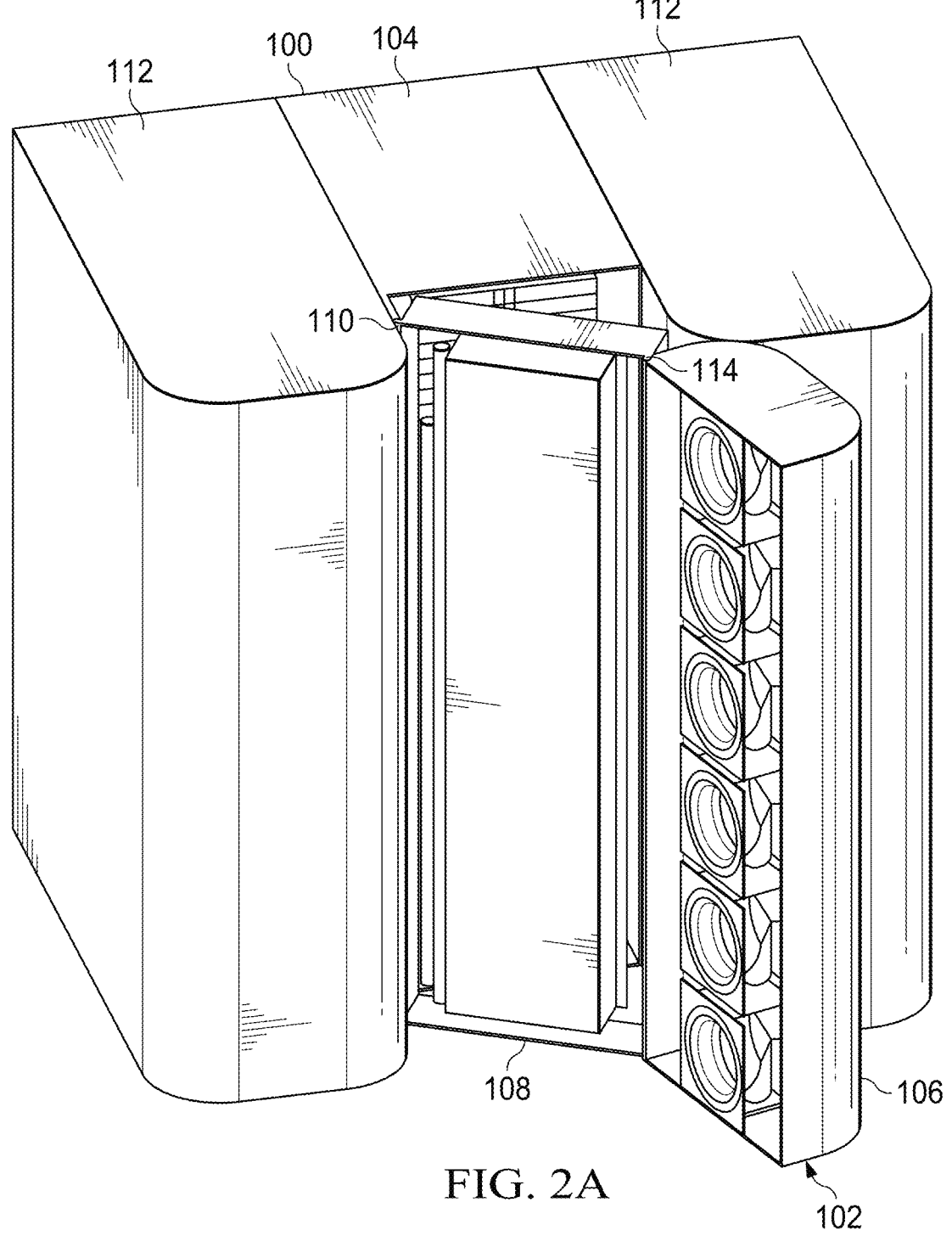
FIG. 2A illustrates an isometric perspective view of a cabinet with its door in a first open position, in accordance with embodiments of the present disclosure.
Figure 2B:
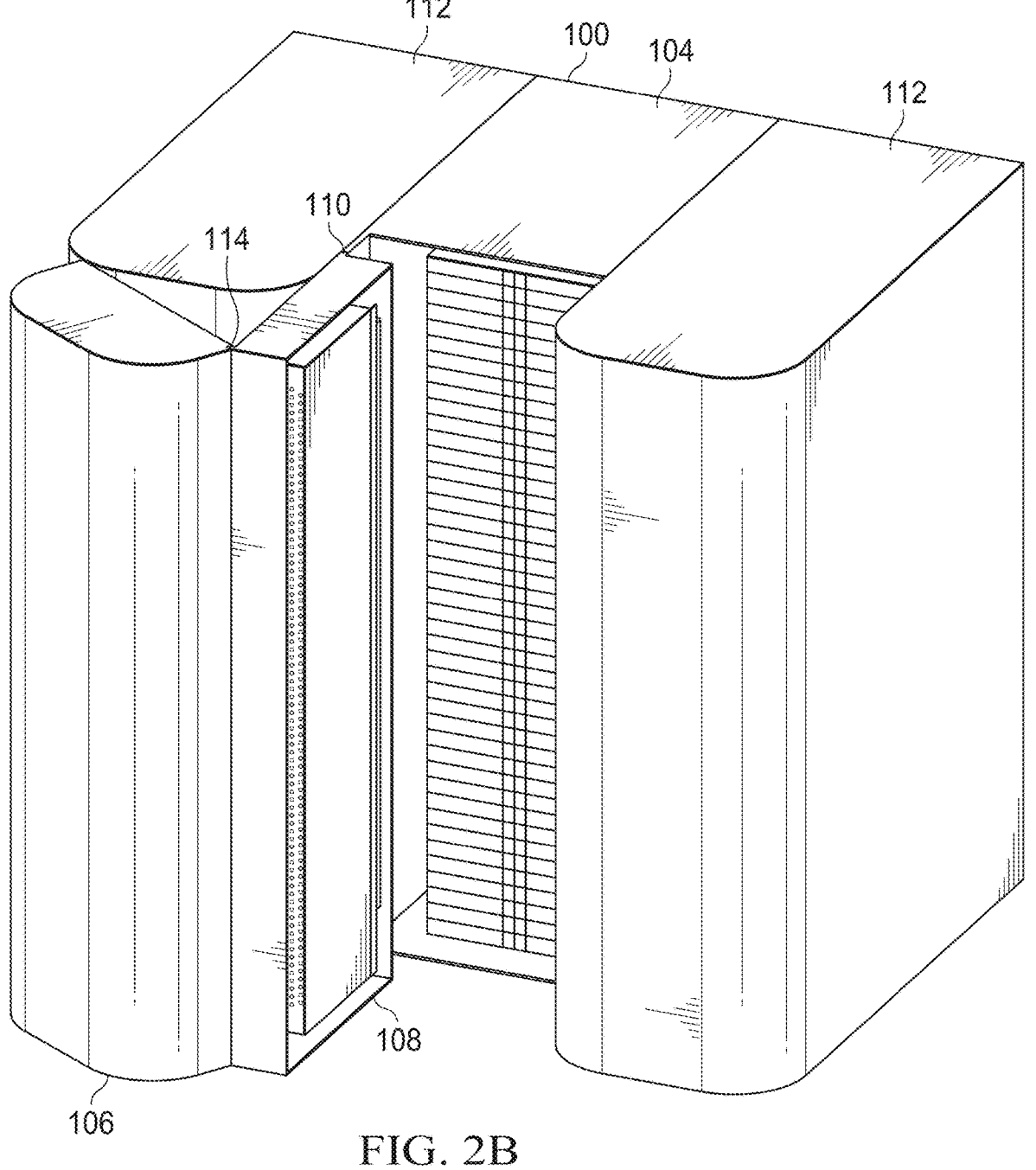
FIG. 2B illustrates an isometric perspective view of a cabinet with its door in a second open position, in accordance with embodiments of the present disclosure.

FIG. 1A illustrates a top-down plan view of a cabinet 100 with its door 102 in a closed position, in accordance with embodiments of the present disclosure. FIG. 1B illustrates a top-down plan view of cabinet 100 with door 102 in an open position, in accordance with embodiments of the present disclosure. FIG. 2A illustrates an isometric perspective view of cabinet 100 with door 102 in a first open position, in accordance with embodiments of the present disclosure. FIG. 2B illustrates an isometric perspective view of cabinet 100 with door 102 in a second open position, in accordance with embodiments of the present disclosure.

In the figures, cabinet 100 is shown located between two other cabinets 112, for example in a data center comprising multiple cabinets 100 and 112 for housing information handling systems. In some embodiments, cabinets 112 may be similar or identical to cabinet 100.

As shown in the figures, cabinet 100 may comprise door 102 mechanically coupled to rack 104. Rack 104 may comprise a plurality of vertically-stacked slots configured to accept information handling systems and a plurality of power supplies that provide electrical energy to the information handling systems. Rack 104 may also be referred to as a housing, enclosure, chassis, or other appropriate term.

As also shown in the figures, door 102 may comprise an air mover assembly 106 and a cooling coil assembly 108. Air mover assembly 106 may comprise a mechanical structure with one or more air movers housed therein for driving airflow within cabinet 100. Cooling coil assembly 108 may comprise a mechanical structure with one or more radiator coils housed therein for transferring heat from air flowing proximate to the one or more radiator coils to liquid (e.g., water) flowing through the one or more radiator coils.

As shown in the figures, cooling coil assembly 108 may be rotatably coupled, via a first vertical edge of cooling coil assembly 108, to rack 104 via a hinge assembly 110 comprising one or more hinges. In addition, cooling coil assembly 108 may be rotatably coupled, via a second vertical edge of cooling coil assembly 108, to air mover assembly 106 via a hinge assembly 114 comprising one or more hinges. The axis of rotation of hinge assembly 110 may be substantially parallel to the axis of rotation of hinge assembly 114.

In operation, a technician may access the interior of cabinet 100 by applying a mechanical force to pull on air mover assembly 106 to cause air mover assembly 106 to rotate relative to cooling coil assembly 108 and/or cooling coil assembly 108 to rotate relative to rack 104, thus providing access to rack 104 (e.g., from an aisle proximate to door 102). As seen in FIGS. 1B and 2B, the arrangement of air mover assembly 106, cooling coil assembly 108, and rack 104 may allow the technician to fully open cooling coil assembly 108 relative to rack 104, without air mover assembly 108 mechanically interfering with a neighboring cabinet 112. Further, such arrangement may, in addition to enabling access to rack 104, allow the technician to arrange air mover assembly 106 and cooling coil assembly 108 relative to each other and relative to rack 104 such that the technician may service the front of air mover assembly 106 and the rear of cooling coil assembly 108 in a configuration such as that shown in FIG. 2A and may also service rack 104 and the front of cooling coil assembly 108 in a configuration such as that shown in FIG. 2B.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described above.

Unless otherwise specifically noted, articles depicted in the drawings are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

What is claimed is:

1. A cabinet comprising:
a rack configured to house one or more information handling systems; and
a door comprising:
a first mechanical assembly comprising at least one cooling coil configured to rotatably couple, via a first vertical edge of the first mechanical assembly, to the rack via a first hinge assembly; and
a second mechanical assembly comprising at least one air mover configured to rotatably couple, via a second vertical edge of the first mechanical assembly, to the first mechanical assembly via a second hinge assembly, such that an axis of rotation of the first hinge assembly is substantially parallel to an axis of rotation of the second hinge assembly, wherein the second mechanical assembly overlaps the first mechanical assembly when the door is in a closed position.

2. The cabinet of claim 1, wherein to access the rack when the cabinet is positioned between adjacent cabinets, the second mechanical assembly must rotate relative to the first mechanical assembly and the first mechanical assembly must rotate relative to the rack.

3. A door configured to mechanically couple to a rack configured to house one or more information handling systems, the door comprising:
a first mechanical assembly comprising at least one cooling coil configured to rotatably couple, via a first vertical edge of the first mechanical assembly, to the rack via a first hinge assembly; and
a second mechanical assembly comprising at least one air mover configured to rotatably couple, via a second vertical edge of the first mechanical assembly, to the first mechanical assembly via a second hinge assembly, such that an axis of rotation of the first hinge assembly is substantially parallel to an axis of rotation of the second hinge assembly, wherein the second mechanical assembly overlaps the first mechanical assembly when the door is in a closed position.

4. The door of claim 3, wherein to access the rack when the door is positioned between adjacent structures, the second mechanical assembly must rotate relative to the first mechanical assembly and the first mechanical assembly must rotate relative to the rack.

5. A method comprising:
rotatably coupling a first mechanical assembly of a door, via a first vertical edge of the first mechanical assembly, to a rack configured to house one or more information handling systems via a first hinge assembly, wherein the first mechanical assembly comprises at least one cooling coil; and
rotatably coupling a second mechanical assembly, via a second vertical edge of the first mechanical assembly, to the first mechanical assembly via a second hinge assembly, such that an axis of rotation of the first hinge assembly is substantially parallel to an axis of rotation of the second hinge assembly, wherein the second mechanical assembly overlaps the first mechanical assembly when the door is in a closed position, and wherein the second mechanical assembly comprises at least one air mover.

6. The method of claim 5, wherein to access the rack when the door is positioned between adjacent structures, the second mechanical assembly must rotate relative to the first mechanical assembly and the first mechanical assembly must rotate relative to the rack.

* * * * *